(12) United States Patent
Kwon (10) Patent No.: US 12,125,720 B2
(45) Date of Patent: Oct. 22, 2024

(54) LIGHT TREATING MEMBER, SUBSTRATE TREATING APPARATUS INCLUDING THE SAME AND SUBSTRATE TREATING METHOD

(71) Applicant: SEMES CO., LTD., Cheonan-si (KR)

(72) Inventor: Oh Jin Kwon, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 364 days.

(21) Appl. No.: 17/553,868

(22) Filed: Dec. 17, 2021

(65) Prior Publication Data

US 2022/0199434 A1 Jun. 23, 2022

(30) Foreign Application Priority Data

Dec. 18, 2020 (KR) ........................ 10-2020-0178075

(51) Int. Cl.
*H01L 21/67* (2006.01)
*H05B 45/12* (2020.01)
*H05B 45/14* (2020.01)
*H05B 45/52* (2020.01)
*H01L 21/02* (2006.01)

(52) U.S. Cl.
CPC .. *H01L 21/67115* (2013.01); *H01L 21/67023* (2013.01); *H05B 45/12* (2020.01); *H05B 45/14* (2020.01); *H05B 45/52* (2020.01); *H01L 21/02348* (2013.01)

(58) Field of Classification Search
CPC ......... H01L 21/67115; H01L 21/67023; H01L 21/02348; H05B 45/14; H05B 45/12; H05B 45/52
See application file for complete search history.

(56) References Cited

U.S. PATENT DOCUMENTS

2012/0229534 A1* 9/2012 Umetsu .................... B41J 3/407
347/2

FOREIGN PATENT DOCUMENTS

| CN | 106024803 | 10/2016 |
|---|---|---|
| CN | 111670609 | 9/2020 |
| CN | 112002287 | 11/2020 |
| JP | 2006040944 | 2/2006 |
| JP | 6066613 | 1/2017 |
| JP | 2017-130629 | 7/2017 |
| JP | 2017183358 | 10/2017 |
| JP | 2018060593 | 4/2018 |
| JP | 2020-107433 | 7/2020 |
| JP | 2020-136128 | 8/2020 |
| KR | 10-1058771 | 8/2008 |
| KR | 10-2017-0084608 | 7/2017 |
| KR | 10-2017-0113128 | 10/2017 |

(Continued)

OTHER PUBLICATIONS

Office Action from the Taiwan Intellectual Property Office dated Sep. 7, 2022.

(Continued)

*Primary Examiner* — Nicole M Ippolito (57) ABSTRACT

The inventive concept provides a light treating member for performing a light treatment on a substrate. The light treating member comprises a circuit unit comprising a plurality of LED module units connected in series, each LED module unit comprising a plurality of identical LED modules connected with each other in parallel.

18 Claims, 7 Drawing Sheets

(56) References Cited

FOREIGN PATENT DOCUMENTS

KR  10-1885559  8/2018
KR  10-2061667  1/2020

OTHER PUBLICATIONS

Office Action from Japan Patent Office dated Jan. 10, 2023.
Office Action from Korean Intellectual Property Office dated Jan. 11, 2023.
Office Action from the Korean Intellectual Property Office dated Jul. 21, 2023.
Office Action from the China National Intellectual Property Administration dated May 29, 2024.

\* cited by examiner

LIGHT TREATING MEMBER, SUBSTRATE TREATING APPARATUS INCLUDING THE SAME AND SUBSTRATE TREATING METHOD

CROSS-REFERENCE TO RELATED APPLICATIONS

A claim for priority under 35 U.S.C. § 119 is made to Korean Patent Application No. 10-2020-0178075 filed on Dec. 18, 2020, in the Korean Intellectual Property Office, the entire contents of which are hereby incorporated by reference.

BACKGROUND

Embodiments of the inventive concept described herein relate to a light treating member, a substrate treating apparatus including the same and a substrate treating method.

Various processes such as a photolithography process, an etching process, an ashing process, an ion implantation process, a thin film deposition process, and a cleaning process are carried out to manufacture a semiconductor device or a flat plate display panel. Among them, the etching process is a process of removing unnecessary regions from the thin film formed on the substrate, and a high selectivity and high etching rate for the thin film are required. In addition, during the above process, a process of light-treating the substrate may be accompanied.

Conventionally, there was a tendency to use an IR or a UP lamp to perform light treatment on the substrate. However, there is a problem that the lamp cannot be used for a long time due to its short life, so an LED (light emitting diode) with a long life is used. In general, by connecting and using LED circuits connected with each other in series, the same current may flow, but when an error at any one of LEDs connected with each other in series, the entire LED circuit is broken, causing a problem in the process.

SUMMARY

Embodiments of the inventive concept provide a light treating member, with a circuit structure which does not affect an entire process even if an error occurs at an LED module.

The technical objectives of the inventive concept are not limited to the above-mentioned ones, and the other unmentioned technical objects will become apparent to those skilled in the art from the following description.

The inventive concept provides a light treating member performing a light treatment on a substrate.

In an embodiment, the light treating member comprises a circuit unit to which a plurality of identical LED modules are connected, wherein the circuit unit comprises a plurality of LED module units in which a plurality of identical LED modules are connected in parallel, and wherein the circuit unit is connected in series with the plurality of LED module units.

In an embodiment, the LED module unit further comprises a current sensor connected to any one of the plurality of identical LED modules connected in parallel in the LED module unit.

In an embodiment, a current flowing in the plurality of LED module units is controlled by a constant current control such that a current of a constant value flows.

In an embodiment, the current sensor measures an electrical current flowing through the LED modules connected in parallel within the LED module unit, and the light treating member further comprises a monitoring unit for monitoring whether the LED modules included in the circuit unit is normal, using the sensing value measured by the current sensor.

In an embodiment, the monitoring unit generates an alarm when a value calculated by dividing the constant electrical current value by the number of the LED modules included in the LED module unit is different from a value measured at the current sensor.

In an embodiment, the monitoring unit generates a notice of an abnormality in the LED module unit including the current sensor when a value calculated by dividing the constant current value by the number of the LED modules included in the LED module unit is different from a value measured at the current sensor.

In an embodiment, the light treating member further comprises an illuminance sensor for measuring an amount of light through the circuit unit.

In an embodiment, the LED module comprises a plurality of diodes.

In an embodiment, the LED module is a UV LED.

The inventive concept provides a substrate treating apparatus.

In an embodiment, the substrate treating apparatus comprises: a support member supporting a substrate; a treating liquid nozzle supplying a treating liquid to a substrate supported by the support member; and a light treating member for performing a light treatment on the substrate supported by the support member, the light treating member comprises a circuit unit to which a plurality of identical LED modules are connected, wherein the circuit unit comprises a plurality of LED module units in which a plurality of identical LED modules are connected in parallel, wherein the circuit unit is connected in series with the plurality of LED module.

In an embodiment, the LED module unit further comprises a current sensor connected to any one of the plurality of identical LED modules connected in parallel in the LED module unit.

In an embodiment, a current flowing in the plurality of LED module units is controlled by a constant current control such that a current of a constant value flows.

In an embodiment, the current sensor measures an electrical current flowing through the LED module connected in parallel within the LED module unit, and the light treating member further comprises a monitoring unit for monitoring whether the LED modules included in the circuit unit is normal, using the sensing value measured by the current sensor.

In an embodiment, the monitoring unit generates an alarm when, a value calculated by dividing the constant electrical current value by the number of LED modules included in the LED module unit is different from a value measured at the current sensor.

In an embodiment, the monitoring unit generates a notice of an abnormality in the LED module unit including the current sensor when a value calculated by dividing the constant current value by the number of LED modules included in the LED module unit is different from a value measured at the current sensor.

In an embodiment, the light treating member further comprises an illuminance sensor for measuring an amount of light through the circuit unit.

In an embodiment, the LED module comprises a plurality of diodes.

In an embodiment, the LED module is a UV LED.

The inventive concept provides a method for treating a substrate using a substrate treating apparatus.

In an embodiment, the method for treating a substrate comprises: sensing an electrical current flowing in each LED module unit using the current sensor; and generating an alarm when a value calculated by dividing the constant electrical current value by the number of the LED modules included in the LED module unit is differ from a value measured by the current sensor.

In an embodiment, the generating the alarm comprises generating a notice of an abnormality in the LED module unit including the current sensor measuring a current value different from the value calculated by dividing the constant electrical current value by the number of the LED modules included in the LED module unit.

According to an embodiment of the inventive concept, an entire process may not be affected even if a problem occurs on a part of the LED modules.

According to an embodiment of the inventive concept, an occurrence of a problem is rapidly confirmed through a monitoring of a current sensor, enabling action before the problem affects a process.

The effects of the inventive concept are not limited to the above-described effects. Effects not mentioned will be clearly understood by those skilled in the art to which this invention pertains from this specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

In the specification, the singular forms include plural forms unless particularly mentioned. Also, the shapes or sizes of elements in a figure may be exaggerated for a clearer illustration.

Although not defined, all the terms (including technical or scientific terms) used herein may have the same meanings that are generally accepted by the common technologies in the field to which the inventive concept pertains. The terms defined by the general dictionaries may be construed to have the same meanings as those meant in the related technologies and the disclosure of the application, and will neither become conceptual nor be construed to be excessively formal even though not clearly defined herein. The terms used herein are provided to describe the embodiments but not to limit the inventive concept. In the specification, the singular forms include plural forms unless particularly mentioned. The expressions 'include' and its various conjugated forms, such as 'including', which are used in the specification do not exclude existence or addition of one or more compositions, substances, elements, steps, operations, and devices.

The terms "unit", "part", and the like may be used to indicate a unit of processing at least one function or operation. For example, such terms may mean software, or a hardware element such as FPGA or ASIC. However, such terms are not limited to software or hardware. The "unit", "part", and the like may be configured to be included within an addressable storage medium or to operate one or more processors.

Thus, "unit", "part", and the like may include constituent elements such as software elements, Object-Oriented software elements, class elements, and task elements, processes, functions, attributes, procedures, sub-routines, segments of program code, drivers, firmware, micro code circuit, data, database, data structures, tables, arrays, and variables. Elements and functions provided within the "unit", "part", and the like may be divided into elements and "unit", "part" and the like, or may be jointed with other additional number of elements.

Hereinafter, an embodiment of the inventive concept will be described in more detail with reference to the accompanying drawings. The embodiment of the inventive concept may be modified into various forms, and the scope of the inventive concept should not be construed as being limited to the following embodiments. The present embodiment is provided to more fully explain the inventive concept to those with average knowledge in the art. Therefore, the shape of the elements in the drawings is exaggerated to emphasize a clearer explanation.

Figure 1:
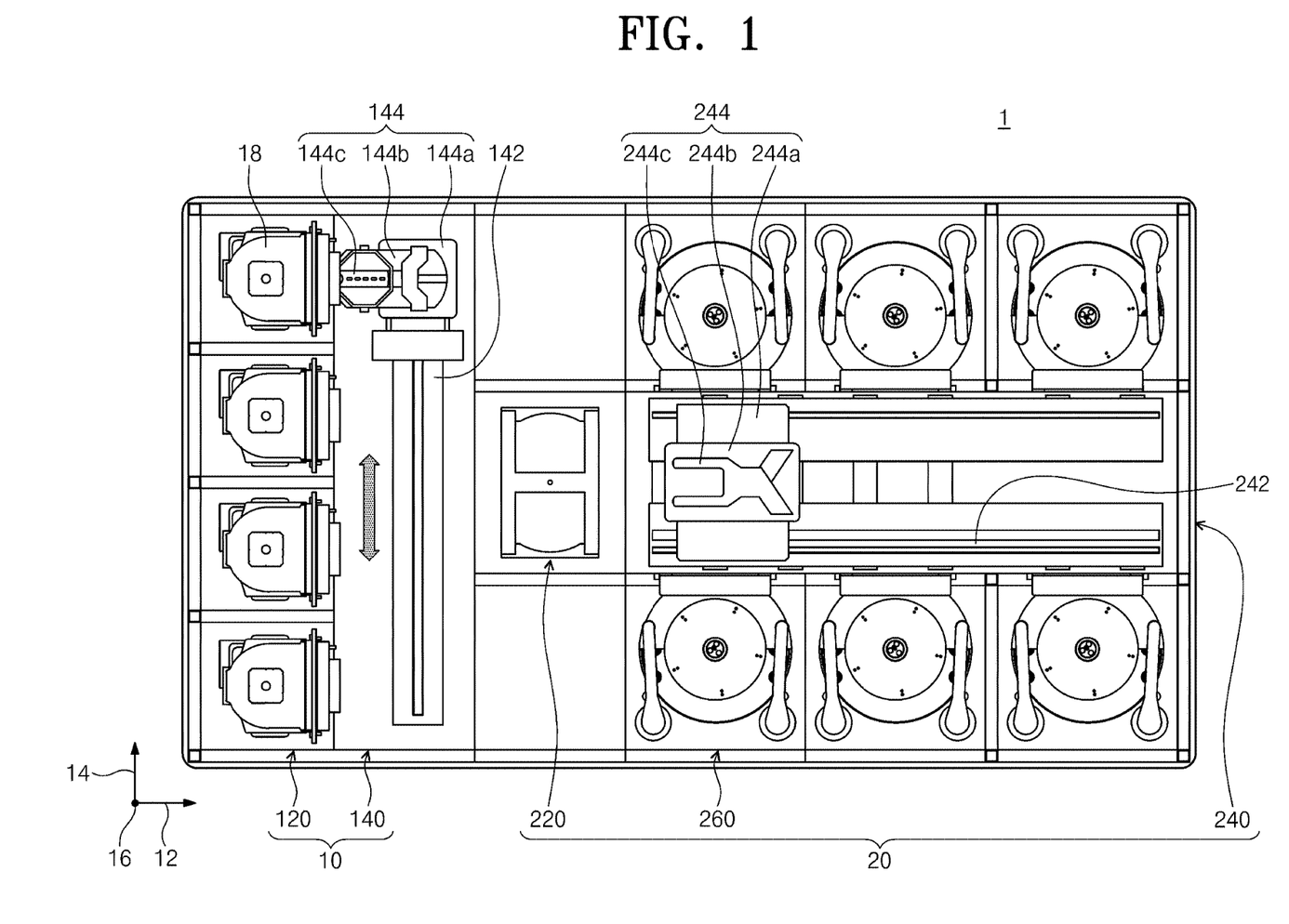
FIG. 1 is a plan view illustrating a substrate treating facility according to an embodiment of the inventive concept.

FIG. 1 is a plan view of a substrate treating facility according to an embodiment of the inventive concept.

Referring to FIG. 1, the substrate treatment facility 1 comprises an index module 10 and a processing module 20. The index module 10 has a load port 120 and an transfer frame 140. The load port 120, the transfer frame 140, and the processing module 20 are sequentially arranged in a direction. Hereinafter, a direction in which the load port 120, the transfer frame 140, the processing module 20 are arranged will be referred to as a first direction 12, a direction that is perpendicular to the first direction 12 when viewed from above will be referred to as a second direction, and a direction that is perpendicular to both the first direction 12 and the second direction 14 will be referred to as a third direction 16.

At the load port 120 a carrier 18 storing a substrate W is placed. The load port 120 is provided in a plurality and they are arranged in a row in the second direction 14. A number of load ports 120 may increase or decrease depending on a process efficiency or a footprint condition, etc of the processing module 20. At the carrier a plurality of slots (not shown) are formed for storing the substrates horizontally to the ground. For the carrier 18, a closing-type container such as the Front Open Unified Pod (FOUP) can be used.

The processing module 20 includes a buffer unit 220, a transfer chamber 240, and a process chamber 260. The transfer chamber 240 may be provided such that its lengthwise direction is parallel to the first direction 12. The process chambers 260 are placed at each side of the transfer chamber 240. At one side and at another side of the transfer chamber 240, the process chambers 260 are provided symmetrically based on the transfer chamber 240. A plurality of process chambers 260 are provided at a side of the transfer chamber 240. A part of the process chambers 260 are provided along a direction of a length of the transfer chamber 240. Also, a part of the process chambers 260 are provided stacked one above another. In other words, the process chambers 260 may be provided in an array of A×B at a side of the transfer chamber 240. Here A is a number of process chambers 260 arranged in a row in the first direction 12, B is a number of process chambers 260 arranged in a row in the third direction 16. When four or six process chambers 260 are provided at a side of the transfer chamber 240, the process chambers 260 may be arranged in an array of 2×2 or 3×2. A number of process chambers may increase or decrease. Unlike the aforementioned, the process chambers 260 may be provided only at a side of the transfer chamber 240. Also, the transfer chamber 260 may be provided at a side or both sides of the transfer chamber 240 as one floor.

The buffer unit 200 can be placed between the transfer frame 140 and the transfer chamber 240. The buffer unit 220 provides a space for the substrate W to temporarily stay before the substrate W is transferred between the transfer chamber 240 and the transfer frame 140. At an inside of the buffer unit 220 a slot (not shown) is provided for placing the substrate W on. The slots (not shown) may be provided in a plurality and spaced apart in the third direction 16. A side of the buffer unit 220 facing the transfer frame 140 and a side of the buffer unit 220 facing the transfer chamber 240 is provided open.

The transfer frame 140 transfers the substrate W between the carrier 18 located at the load port 120 and the buffer unit 220. The transfer frame 140 is provided with an index rail 142 and an index robot 144. The index rail 142 is provided such that its lengthwise direction is parallel to the second direction 14. The index robot 144 is installed at the index rail 142 and is linearly moved in the second direction 14 along the index rail 142. The index robot 144 has a base 144a, a body 144b, and an index arm 144c. The base 144a is installed to be movable along the index rail 142. The body 144b is coupled to the base 144a. The body 144b is provided to be movable along the third direction 16 on the base 144a. In addition, the body 144b is provided to be rotatable on the base 144a. The index arm 144c is coupled to the body 144b and is provided to be forwardly and backwardly movable with respect to the body 144b. A plurality of index arms 144c are provided to be individually driven. The index arms 144c are disposed to be stacked one above another while being spaced apart from each other in the third direction 16. Some of the index arms 144c may be used to transfer the substrate W from the processing module 20 to the carrier 18, and the other index arms 144c may be used to transfer the substrate W from the carrier 18 to the processing module 20. This may prevent particles generated from the substrate W before processing from being attached to the substrate W after processing in a process of bringing in and taking out the substrate W by the index robot 144.

The transfer chamber 240 transfers the substrate W between the buffer unit 220 and the process chamber 260 and between the process chambers 260. The transfer chamber 240 is provided with a guide rail 242 and a main robot 244. The guide rail 242 is provided such that its lengthwise direction is parallel to the first direction 12. The main robot 244 is installed on the guide rail 242 and is linearly moved along the first direction 12 on the guide rail 242. The main robot 244 has a base 244a, a body 244b, and a main arm 244c. The base 244a is installed to be movable along the guide rail 242. The body 244b is coupled to the base 244a. The body 244b is provided to be movable along the third direction 16 on the base 244a. In addition, the body 244b is provided to be rotatable on the base 244a. The main arm 244c is coupled to the body 244b, which is provided to be forwardly and backwardly movable with respect to the body 244b. A plurality of main arms 244c are provided to be individually driven. The main arms 244c are disposed to be stacked while being spaced apart from each other in the third direction 16.

The process chamber 260 performs a processing on the substrate W. The processes treated in the process chamber 260 are all the same, but may be two or more different processes.

Figure 2:
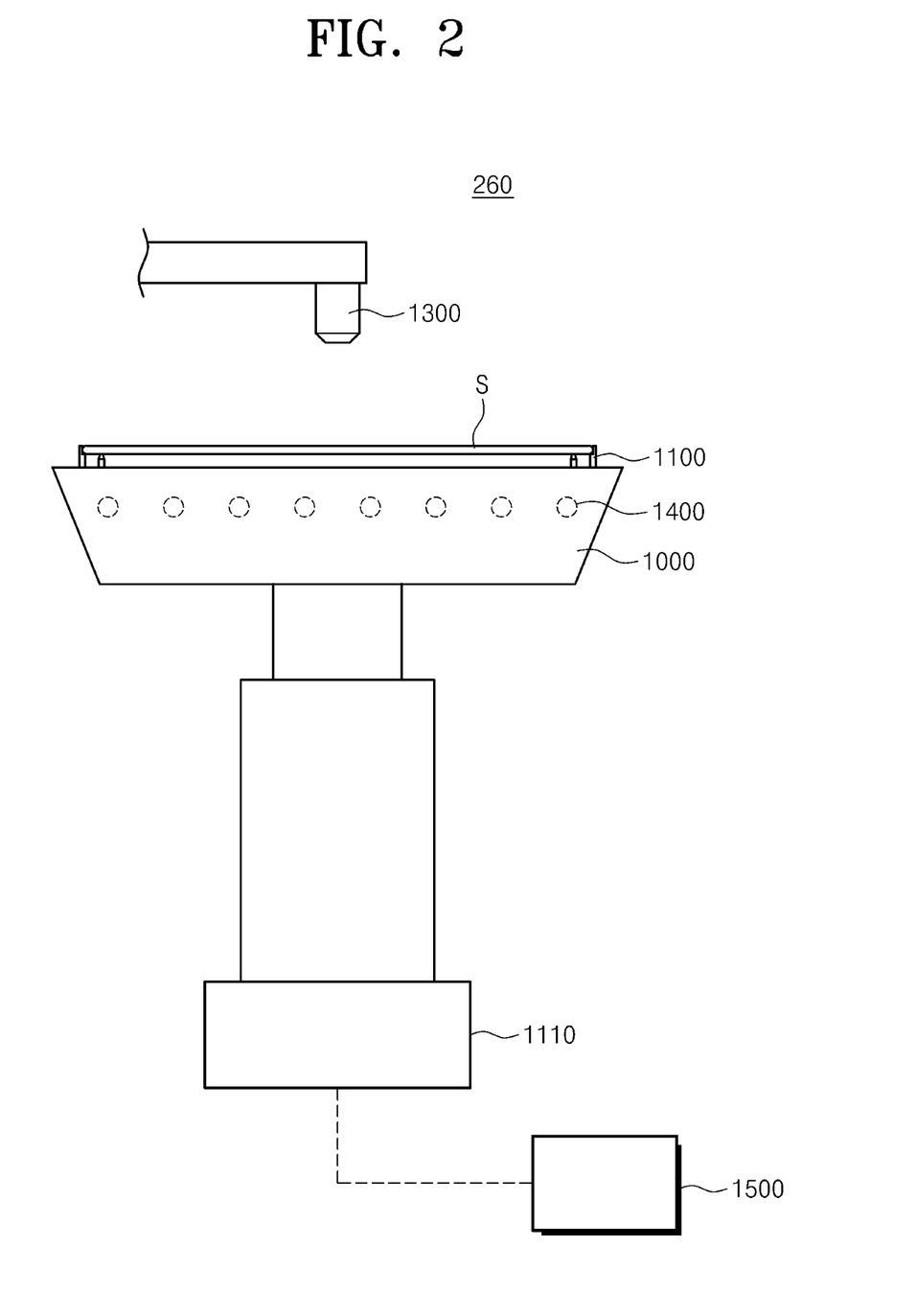
FIG. 2 is a view illustrating a substrate treating apparatus according to an embodiment of the inventive concept.

FIG. 2 is a view illustrating a substrate treating apparatus according to an embodiment of the inventive concept.

Referring to FIG. 2, the process chamber 260 includes a support member 1000, a treating liquid nozzle 1300, a light treating member 1400, and a controller 1500.

The support member 1000 supports a substrate S during the process. The support member 1000 is provided such that a top surface thereof has a set area. For example, the support member 1000 may have an area larger than that of the substrate S and may support the substrate S with a pin 1100 provided on the top surface thereof so that the substrate S is supported while a bottom surface of the substrate S is spaced apart from the top surface of the support member 1000. In addition, the support member 1000 may be provided to fix the substrate S by vacuum-suctioning the substrate S with a top surface larger or smaller than the substrate S. The support member 1000 may be rotatably provided by the power provided by the driver 1110 to rotate the substrate S during the process.

The treating liquid nozzle 1300 discharges the treating liquid for treating the substrate S to the substrate S located on the support member 1000. The treating liquid may be a phosphoric acid. In addition, the treating liquid may be a chemical such as a sulfuric acid (H2SO4), a nitric acid (HNO3), an ammonia (NH3), etc.

The light treating member 1400 may perform a light treatment on the substrate S during processing. For example, the light treating member 1400 may be provided in a form located on the support member 1000.

Figure 3:
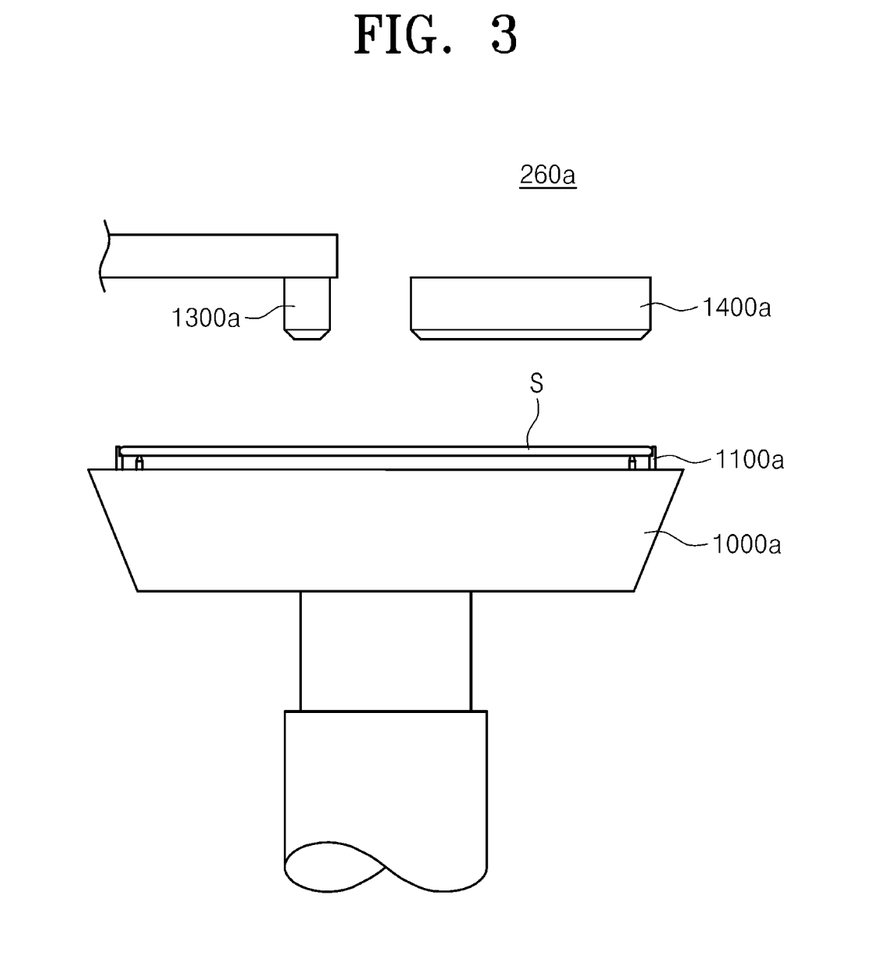
FIG. 3 is a view illustrating a substrate treating apparatus according to another embodiment of the inventive concept.

FIG. 3 is a view illustrating a substrate treating apparatus according to another embodiment.

Referring to FIG. 3, the process chamber 260*a* includes a support member 1000*a*, a treating liquid nozzle 1300*a*, and a light treating member 1400*a*.

The light treating member 1400*a* may be provided as a laser source that is spaced apart from the support member 1000*a* by a predetermined distance and irradiates a laser to the substrate S located on the support member 1000*a*.

According to an embodiment, the light treating member 1400*a* may emit a laser light in the form of a line beam having a set length. The laser light may be emitted over a rotation center of the substrate S and an outer end of the substrate S. Accordingly, when the substrate S is rotated, the laser light may be irradiated over an entire top surface of the substrate S.

In addition, the light treating member 1400*a* may be provided to irradiate the laser in a form in which a laser having a set area moves between the rotation center and the outer end of the substrate S.

Figure 4:
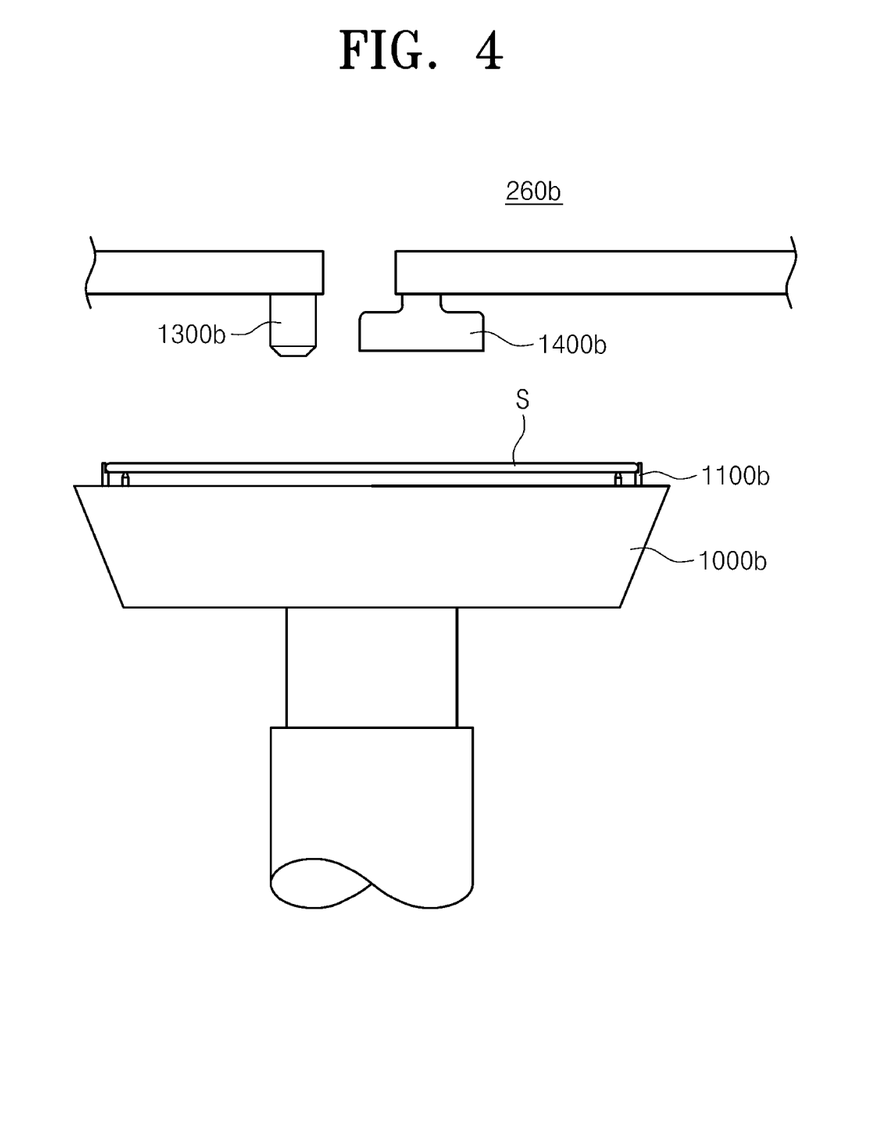
FIG. 4 is a view illustrating a substrate treating apparatus according to another embodiment of the inventive concept.

FIG. 4 is a view illustrating a substrate treating apparatus according to another embodiment.

Referring to FIG. 4, the process chamber 260*b* includes a support member 1000*b*, a treating liquid nozzle 1300*b*, and a light treating member 1400*b*.

The light treating member 1400*b* may be provided in a form of a radiant heating of the substrate S located on the support member 1000*b* by being spaced apart from the support member 1000*b* by a set distance upward. For example, the light treating member 1400*b* may be provided in a form of heating the substrate S through a heat generated by a lamp, a resistance heat, or the like.

Hereinafter, features of the light treating member 1400 according to the inventive concept will be described in detail.

The light treating member 1400 according to the inventive concept may include a circuit unit having a plurality of identical LED modules 1410.

Figure 5:
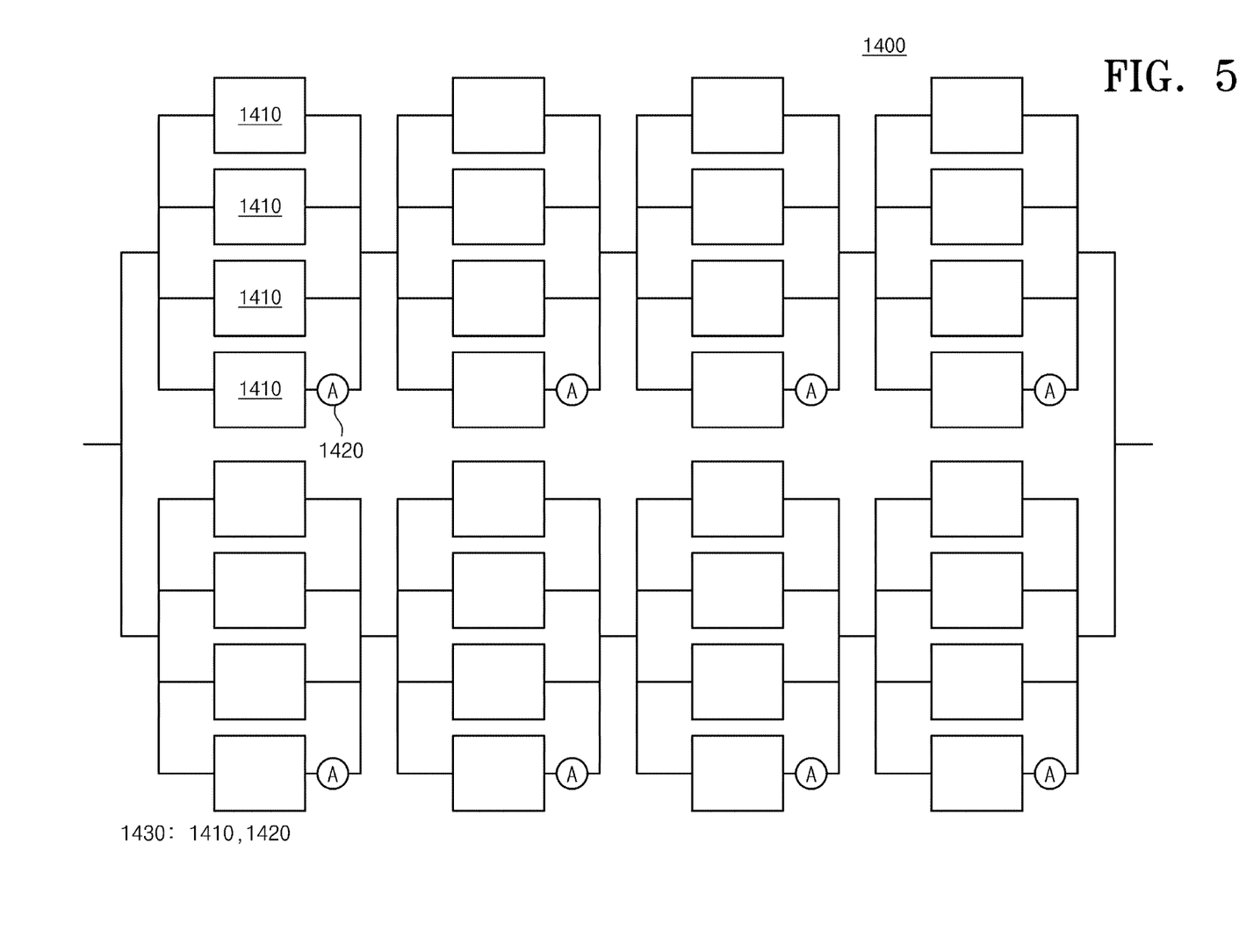
FIG. 5 is a view illustrating a circuit unit according to an embodiment of the inventive concept.

FIG. 5 is a view illustrating a circuit unit according to an embodiment of the inventive concept.

According to the inventive concept, the circuit unit may include a plurality of LED module units 1430 and each LED module unit 1430 comprises a plurality of identical LED modules 1410 (i.e., a plurality of sub-LED modules) connected in parallel with each other. According to an embodiment, the circuit unit may be provided with a plurality of LED module units 1430 connected in series with each other.

That is, referring to FIG. 5, the circuit unit is provided with a configuration in which a plurality of LED module units 1430 are connected in series with each other, and each of the plurality of LED module units 1430 may include LED modules 1410 connected in parallel with each other. In this case, the number of LED modules 1410 included in each of a plurality of LED module units 1430 may be provided equally in the circuit unit. In addition, all electrical characteristics of the LED module 1410 may be the same. According to an embodiment of FIG. 5, four LED module units 1430 may be provided at a top part and four LED module units 1430 at a bottom part, and the number of LED modules 1410 included in each LED module unit 1430 may be provided as four.

According to an embodiment, the LED module unit 1430 may further include a current sensor 1420 connected to any one of a plurality of identical LED modules 1410 connected in parallel with each other.

Referring to FIG. 5, a configuration including one current sensor 1420 per one LED module unit 1430 is disclosed. The current sensor 1420 may measure an electrical current flowing through the LED modules 1410 connected in parallel with each other. When all of the LED modules 1410 included in the circuit unit are normally operated, currents flowing in each LED module unit 1430 are the same as each other and the plurality of LED module units 1430 connected in series with each other are the same configuration as each other, currents flowing in all the LED modules units 1430 may be the same because the number of the LED modules 1410 included in each of the plurality of LED module units 1430 is the same as each other.

The light treating member 1400 may further include a monitoring unit (not shown) for monitoring whether the LED module 1410 included in the circuit unit is normal using a current value sensed by the current sensor 1420.

The monitoring unit may monitor whether the LED module 1410 included in the circuit unit is normal by using a current value measured by the current sensor 1420. When a failure does not occur, the LED module units 1430 may be controlled such that the same constant current may flow through the LED module units 1430. According to an embodiment, if a current flowing through the plurality of LED module units 1430 is I, the current may be divided equally and flow into the LED modules 1410. In this case, all resistors of the LED modules 1410 may be the same. The LED module unit 1430 includes four LED modules 1410 connected in parallel with each other, and the current flowing in each of the LED modules 1410 may be I/4 of the current flow flowing the LED module unit 1430. In addition, a current value measured by the current sensor 1420 may also be I/4. However, when any one of the LED modules included in the LED module unit 1430 fails, the current I is divided equally and flows into three LED modules 1410, and thus the current value measured by the current sensor 1420 may be I/3, which may differ from the current value measured by the current sensor 1420 in normal state (all the LED modules 1410 operates normally).

That is, according to the inventive concept, the monitoring unit may generate an alarm when a value calculated by dividing a current of a predetermined value, i.e., a constant current value by the number of LED modules 1410 included in the LED module unit 1430 is different from a current value measured by the current sensor 1420. The monitoring unit may inform the LED module unit 1430 that there is an abnormality when a value calculated by dividing the constant current value by the number of the LED modules included in the LED module unit is different from a value measured at the current sensor.

In the inventive concept, a constant current control method is used such that a constant current to flows in all of the LED module units 1430, and the monitoring may be performed by comparing the values measured by the current sensor 1420 with the constant current value.

In the inventive concept, by including only one current sensor 1420 per one LED module unit 1430, the integration problem may be solved. In addition, using one current sensor a failure in LED module unit can be detected efficiently.

According to an embodiment, the light treating member 1400 may further include an illumination sensor (not shown) capable of measuring an amount of a light through the circuit unit. Through this, in addition to circuit monitoring through the circuit unit and the monitoring unit, it is possible to double monitor and respond to whether an abnormality has occurred by measuring an actual amount of light.

According to an embodiment, when the LED module unit 1430 is configured with four parallel circuits as shown in FIG. 5, the number of components may be reduced. However, this is only an example, and the number of LED modules 1410 that may be connected with each other in parallel is not limited thereto.

Figure 6:
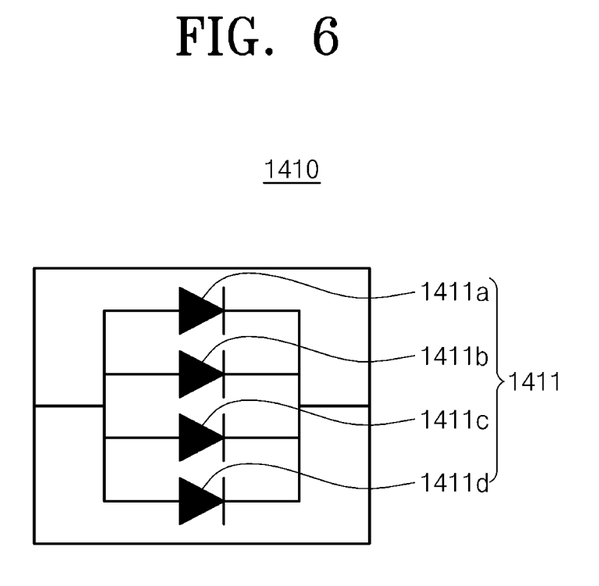
FIG. 6 is a view illustrating an LED module according to an embodiment of the inventive concept.

FIG. 6 is a view illustrating an LED module 1410 according to an embodiment of the inventive concept.

Referring to FIG. 6, the LED module 1410 according to the inventive concept may include a plurality of diodes 1411 (e.g., a plurality of light emitting diodes). In accordance with an embodiment, the LED module 1410 in accordance with this invention may be provided by connecting a plurality of diodes 1411a, 1411b, 1411c, and 1411d with each other in parallel. Accordingly, even if one of a plurality of diodes fails, the current flowing through the corresponding LED module 1410 may be the same. According to an embodiment, the LED module 1410 may use a UV LED. Through this, it is possible to perform the same role as a UV lamp.

Figure 7:
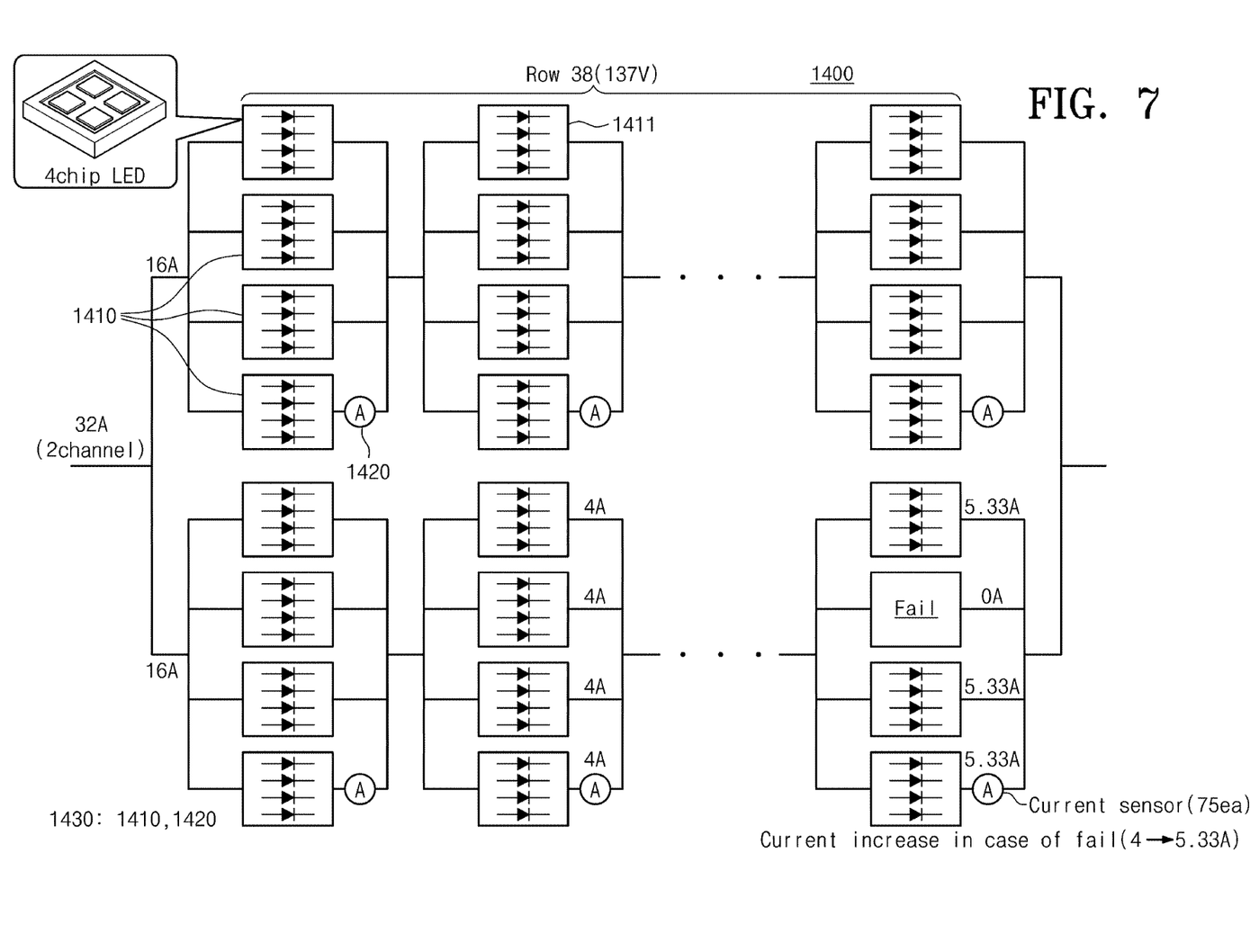
FIG. 7 is a view illustrating a monitoring method to check for an error, using a circuit unit according to an embodiment of the inventive concept.

FIG. 7 is a view illustrating a method of monitoring whether a failure occurs using a circuit unit according to the inventive concept.

Referring to FIG. 7, a case in which a current of 16 A flows through a plurality of LED module units 1430 is illustrated. In this case, since a plurality of LED module units 1430 are connected in series, a current of 16 A may flow. Since a plurality of LED module units 1430 have the same configuration as each other, and four LED modules 1410 are connected in parallel with each other, a current of 4 A may flow in each LED module 1410. In this case, in a normal case, 4 A is measured by the current sensor 1420 in each LED module unit. If an error occurs in any one of a plurality of LED modules 1410, 16 A is divided and flows in three LED modules 1410, and thus 5.33 A flows in each LED module, and thus it can be determined that the LED module unit including the current sensor which measures 5.33 A is failed. That is, through this, the user may recognize that an error has occurred in the LED module unit 1430 and take a proper action. Even in this case, the current flowing through the entire circuit unit is the same, and thus may not affect the process. According to an embodiment, the monitoring unit may set an error range in a value measured by the current sensor 1420 using a constant current value flowing through the entire LED module unit 1430 and the number of parallel LED modules 1410 included in the LED module unit 1430. When a slight difference occurs, the monitoring unit may view it as a simple error and may not generate an alarm. The monitoring unit may calculate in advance the sensed current value when a failure occurs using the constant current value and the number of parallel LED modules, and may set the error range by reflecting the calculated value.

That is, according to the inventive concept, a circuit may be configured such that a plurality of LED module units 1430 are connected with each other in parallel, and a current sensor 1420 may be mounted on the LED module unit 1430 to perform monitoring. Accordingly, even if an error occurs in any one of the plurality of LED modules 1410, all other LEDs are turned on, and it may be detected whether the failure occurs by recognizing the measured value by the current sensor 1420 without affecting the process.

The effect of using such a parallel circuit may not cause process defects due to the same overall light amount since current is distributed and flows to the remaining LEDs other than the failed LED module. In this invention, the current value of the circuit is monitored to detect whether the device has failed, but according to another embodiment, the resistance value of the circuit may be monitored to detect whether the device has failed.

According to the inventive concept, a substrate treatment method for performing a light treatment on a substrate is disclosed.

The method may include sensing a current flowing in each LED module unit 1430 through the current sensor 1420; and generating an alarm when a value calculated by dividing the constant electrical current value by the number of the LED modules included in the LED module unit is differ from a value measured by the current sensor.

In this case, in the step of generating the alarm, a notice may be further notified with the alarm that a failure occurs in the LED module unit including the current sensor measuring a current value different from the value calculated by dividing the constant electrical current value by the number of the LED modules included in the LED module unit.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A light treating member for performing a light treatment on a substrate, the light treating member comprising:
    a circuit unit including a plurality of LED module units connected in series with each other,
    wherein each of the plurality of LED module units includes a plurality of sub-LED modules connected in parallel with each other, and
    wherein the plurality of sub-LED modules are identical with each other.

2. The light treating member of claim 1,
    wherein each LED module unit of the plurality of LED module units comprises a current sensor connected to a first sub-LED module of the plurality of sub-LED modules.

3. The light treating member of claim 2,
    wherein a current flowing in the plurality of LED module units is controlled by a constant current control such that a current of a constant current value flows.

4. The light treating member of claim 3,
wherein the current sensor measures an electrical current flowing through the first sub-LED module of the plurality of sub-LED modules connected in parallel with each other within each LED module unit of the plurality of LED module units, and
wherein the light treating member further comprises a monitoring unit configured to monitor whether the plurality of sub-LED modules included in the circuit unit are in a normal operation, using the electrical current measured by the current sensor.

5. The light treating member of claim 4,
wherein the monitoring unit is configured to generate an alarm when a value calculated by dividing the constant current value by a number of the plurality of sub-LED modules in each LED module unit of the plurality of LED module units is different from the electrical current measured at the current sensor.

6. The light treating member of claim 4,
wherein the monitoring unit is configured to generate a notice of an abnormality in the LED module unit including the current sensor when a value calculated by dividing the constant current value by a number of the plurality of sub-LED modules included in each LED module unit of the plurality of LED module units is different from the electrical current measured at the current sensor.

7. The light treating member of claim 1,
wherein the light treating member further comprises an illuminance sensor configured to monitor an amount of light emitted through the circuit unit.

8. The light treating member of claim 7,
wherein each sub-LED module of the plurality of sub-LED modules comprises a plurality of diodes connected in parallel with each other.

9. The light treating member of claim 8,
wherein each sub-LED module of the plurality of sub-LED modules is a UV LED.

10. A substrate treating apparatus comprising:
a support member configured to support a substrate;
a treating liquid nozzle configured to supply a treating liquid to the substrate supported by the support member; and
a light treating member configured to perform a light treatment on the substrate supported by the support member,
wherein the light treating member comprises:
  a circuit unit including a plurality of LED module units connected in series with each other,
wherein each of the plurality of LED module units includes a plurality of sub-LED modules connected in parallel with each other, and
wherein the plurality of sub-LED modules are identical with each other.

11. The substrate treating apparatus of claim 10,
wherein each LED module unit of the plurality of LED module units comprises a current sensor connected to a first sub-LED module of the plurality of sub-LED modules.

12. The substrate treating apparatus of claim 11,
wherein a current flowing in the plurality of LED module units is controlled by a constant current control such that a current of a constant current value flows.

13. The substrate treating apparatus of claim 12,
wherein the current sensor measures an electrical current flowing through the first sub-LED module of the plurality of sub-LED modules connected in parallel with each other within each LED module unit of the plurality of LED module units, and
wherein the light treating member further comprises a monitoring unit configured to monitor whether the plurality of sub-LED modules included in the circuit unit are in a normal operation, using the electrical current measured by the current sensor.

14. The substrate treating apparatus of claim 13,
wherein the monitoring unit is configured to generate an alarm when, a value calculated by dividing the constant current value by a number of the plurality of sub-LED modules included in each LED module unit of the plurality of LED module units is different from the electrical current measured at the current sensor.

15. The substrate treating apparatus of claim 13,
wherein the monitoring unit is configured to generate a notice of an abnormality in the LED module unit including the current sensor when a value calculated by dividing the constant current value by a number of the plurality of sub-LED modules included in each LED module unit of the plurality of LED module units is different from the electrical current measured at the current sensor.

16. The substrate treating apparatus of claim 10,
wherein the light treating member further comprises an illuminance sensor configured to measure an amount of light emitted through the circuit unit.

17. The substrate treating apparatus of claim 16,
wherein each sub-LED module of the plurality of sub-LED modules comprises a plurality of diodes connected in parallel with each other.

18. The substrate treating apparatus of claim 17,
wherein each sub-LED module of the plurality of sub-LED modules is a UV LED.

* * * * *